(12) United States Patent
Sundararajan et al.

(10) Patent No.: US 8,769,448 B1
(45) Date of Patent: Jul. 1, 2014

(54) CIRCUIT DESIGN SIMULATION

(71) Applicant: Xilinx, Inc., San Jose, CA (US)

(72) Inventors: Arvind Sundararajan, San Jose, CA (US); Nabeel Shirazi, Millbrae, CA (US); Sean P. Caffee, Hillsboro, OR (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/747,940

(22) Filed: Jan. 23, 2013

(51) Int. Cl.
*G06F 17/50* (2006.01)
(52) U.S. Cl.
USPC ........... 716/100; 716/106; 716/107; 716/116; 716/117; 716/138; 703/13; 703/14; 703/23; 703/24; 703/25
(58) Field of Classification Search
CPC ..... G06F 17/50; G06F 17/505; G06F 17/509; G06F 17/5022; G06F 17/5027; G06F 17/5036; G06F 17/5045; G06F 19/00; G06F 2217/86
USPC ................. 703/13–16, 19–21, 23–24, 27–28; 716/100–104, 106–108, 116–117, 716/136–138
See application file for complete search history.

(56) References Cited

U.S. PATENT DOCUMENTS 5,663,900 A * 9/1997 Bhandari et al. .............. 716/106

OTHER PUBLICATIONS

U.S. Appl. No. 13/788,189, filed Mar. 7, 2013, Parekh et al.
Parekh, Umang, *Hardware in the Loop (HIL) Simulation for the Zynq-7000 All Programmable SoC*, XAPP744 (v1.0.2), Nov. 2, 2012, pp. 1-28, Xilinx, Inc., San Jose, California, USA.

* cited by examiner

*Primary Examiner* — Paul Dinh
(74) *Attorney, Agent, or Firm* — LeRoy D. Maunu; Lois D. Cartier

(57) ABSTRACT

In one embodiment, a method is provided for processing a circuit design having first and second sets of ports configured to couple to respective first and second sets of ports of a device on a hardware platform. In a data-acquisition mode, the circuit design is simulated using a user-selectable plug-in that couples the ports of the circuit design to an interface circuit. During the simulation, the interface circuit communicates data between respective ports of the circuit design and ports of the device. In a deployment mode, the circuit design is implemented in the hardware platform, in which the first and second sets of ports of the circuit design are respectively coupled to the first and second sets of ports of the device.

20 Claims, 7 Drawing Sheets

CIRCUIT DESIGN SIMULATION

TECHNICAL FIELD

The disclosure relates to the simulation and emulation of circuit designs.

BACKGROUND

During the process of developing a circuit design, the behavior of the design is simulated based on a specification of the circuit design. Simulating the design helps to verify correct behavior prior to physical implementation of the circuit. Wasted manufacturing costs due to faulty design may thereby be avoided. Numerous tools are available for simulating circuit designs including, for example, high-level modeling systems (HLMS).

An HLMS is a software tool in which circuit designs can be described in a hardware description language (e.g., HDL and VHDL), simulated, and translated into executable simulation code or into a configuration data stream that can be used to configure a programmable integrated circuit (IC) of a hardware platform to implement the circuit design. In some applications, a circuit design implemented in the programmable IC is configured to communicate with one or more other circuits of a hardware platform (e.g., an input/output interface) that are coupled to the programmable IC.

In an HLMS-based design, there may be some components external to the HLMS environment that under certain circumstances, are desirable to have involved in HLMS simulations. For instance, in some applications, a circuit design to be implemented in a programmable IC of a hardware platform is configured to communicate with one or more hardware devices (e.g., an input/output interface) of the hardware platform. In some development flows, after development of the circuit design in the HLMS, the circuit design is implemented in the hardware platform to verify proper operation of the circuit design with the hardware devices by monitoring input and output signals. For ease of reference, configuration of the programmable IC to implement the circuit design may be referred to as deployment of the circuit design or emulation of the circuit design, and such terms may be used interchangeably herein. Based on the monitored input and output signals of the deployed circuit design, further modification to the circuit design may be required along with simulation and subsequent verification of the modified circuit design in the programmable IC.

In some development flows, data signals captured from one or more hardware devices of the hardware platform are incorporated into an HLMS-based simulation. This may be referred to as co-simulation. Example co-simulation platforms include both software-based and hardware-based systems. In the software-based system, for example, a portion of the design is simulated with software running on a workstation. During simulation, data signals are communicated to and from the devices of the hardware platform to capture relevant data from the hardware devices that may be used to identify incorrect inter-operation of the circuit design with the hardware devices. In this manner, development of the circuit design may be achieved with fewer cycles of development, simulation, and verification.

In such co-simulation, the programmable IC of the hardware platform is configured to implement an interface circuit that provides data signals between the HLMS and the hardware devices of the hardware platform during simulation. The interface circuit is configured by a designer to communicate data signals to and from desired ports of external circuits. The circuit design is also configured by the designer to map ports of the circuit design to correct ports of the interface circuit. Moreover, after simulation of the circuit design in the HLMS, the circuit design must be reconfigured by a designer to map ports of the circuit design directly to ports of the hardware devices of the hardware platform so the circuit design may be implemented in the target programmable IC. Configuration of an interface circuit and mapping of ports is a lengthy manual process, which may present a substantial barrier for a designer.

SUMMARY

A method is provided for processing a circuit design. A user-selectable plug-in associated with an interface circuit and configured for compilation of the circuit design is provided. The plug-in is associated with a device on a hardware platform and with the circuit design. The circuit design has a first set of ports, configured to couple to respective ports of a first set of ports of the associated device. The circuit design also has a second set of ports, configured to couple to respective ports of a second set of ports of the associated device. In response to user input and the plug-in being in a data-acquisition mode, a simulation model of the circuit design is generated. In the simulation model, first and second sets of ports of the circuit design are coupled to respective first and second sets of ports of an interface circuit. In further response to user input and the plug-in being in a data-acquisition mode, the interface circuit is emulated on the hardware platform and the simulation model is simulated in a software simulation environment. During the simulation, the interface circuit provides data from each of the first set of ports of the circuit design to a respective port of the first set of ports of the associated device and provides data from each of the second set of ports of the associated device to a respective port of the second set of ports of the circuit design. In response to user input and the plug-in being in a deployment mode, an implementation of the circuit design is generated. The implementation of the circuit design has the first and second sets of ports of the circuit design respectively coupled to the first and second sets of ports of the associated device.

A system for co-simulation of a portion of a circuit design is also provided. The system includes a hardware platform and a computing arrangement coupled to the hardware platform. The hardware platform includes a programmable integrated circuit (IC) and a device coupled to the programmable IC. The computing arrangement includes a processor and memory. The computing arrangement is configured to associate a user-selectable plug-in with the device on the hardware platform and with the circuit design. The plug-in has a user-selectable data-acquisition mode and deployment mode. The circuit design has a first set of ports, including at least a first port. Each of the first set of ports of the circuit design is configured to couple to a respective port of a first set of ports of the associated device. The circuit design also has a second set of ports, including at least a second port. Each of the second set of ports of the circuit design is configured to couple to a respective port of a second set of ports of the associated device.

In response to user input and the plug-in being in the data-acquisition mode, the computing arrangement generates a simulation model of the circuit design. The simulation model has a first set of ports, each coupled to respective ports of a first set of ports of an interface circuit. The simulation model also has a second set of ports, each coupled to respective ports of a second set of ports of the interface circuit. In further response to the user input and the plug-in being in the data-acquisition mode, the computing arrangement configures programmable IC of the hardware platform to emulate the interface circuit and simulates the simulation model in a software simulation environment. During the simulating, the interface circuit provides data from each of the first set of ports of the circuit design to respective ports of a first set of ports of the associated device and provides data from each of a second set of ports of the associated device to respective ports of the second set of ports of the circuit design.

In response to user input and the plug-in being in the deployment mode, the computing arrangement configures the programmable IC to emulate the circuit design. In the emulated circuit design, each of the first set of ports of the circuit design is coupled to respective ports of the first set of ports of the associated device and each of the second set of ports of the circuit design is coupled to respective ports of the second set of ports of the associated device.

Other embodiments will be recognized from consideration of the Detailed Description and Claims, which follow.

BRIEF DESCRIPTION OF THE DRAWINGS

Various aspects and advantages of the disclosed examples will become apparent upon review of the following detailed description and upon reference to the drawings, in which.

DETAILED DESCRIPTION

Methods and circuits are disclosed for simulation of a circuit design in an HLMS using data captured in pseudo-real time from one or more hardware devices that are to be connected to the circuit design once deployed in a programmable IC. In some embodiments, data is captured from the hardware devices during simulation and buffered by an interface circuit implemented in the programmable IC. In some implementations, data signals are communicated between the interface circuit and the HLMS via a communication channel, e.g., JTAG.

In some embodiments, an HLMS is configured to operate in two modes. One mode is a data acquisition mode in which a circuit design is simulated using data captured in pseudo-real time from hardware devices coupled to a target programmable IC. The second mode is a deployment mode in which the circuit design is implemented within the target programmable IC. In some implementations, while operating in the data acquisition mode, the HLMS configures the target programmable IC to implement a selected interface circuit to communicate data between ports of the circuit design and ports of the hardware devices. For instance, in some implementations, the interface circuit provides data from ports of a first set of ports of the circuit design to respective ports of a first set of ports of the hardware devices, and provides data from a second set of ports of the hardware devices to a second set of ports of the circuit design.

While operating in the data acquisition mode, the HLMS uses a software plug-in, which corresponds to the selected interface circuit and remaps the first and second sets of ports of the circuit design to the interface circuit. Remapping of ports of the circuit design to the interface circuit is performed by the software plug-in, without changing the mapping of ports in source files of the circuit design. This allows the circuit design to be deployed in the programmable IC of the hardware platform, following simulation, without remapping ports of the circuit.

While the first and second sets of ports of the circuit design, may include multiple ports, for ease of reference, the examples are primarily described with reference to an interface circuit configured to provide data from a first port of the circuit design to a first port of a hardware device and provide data from a second port of the hardware device to a second port of the circuit design.

Figure 1:
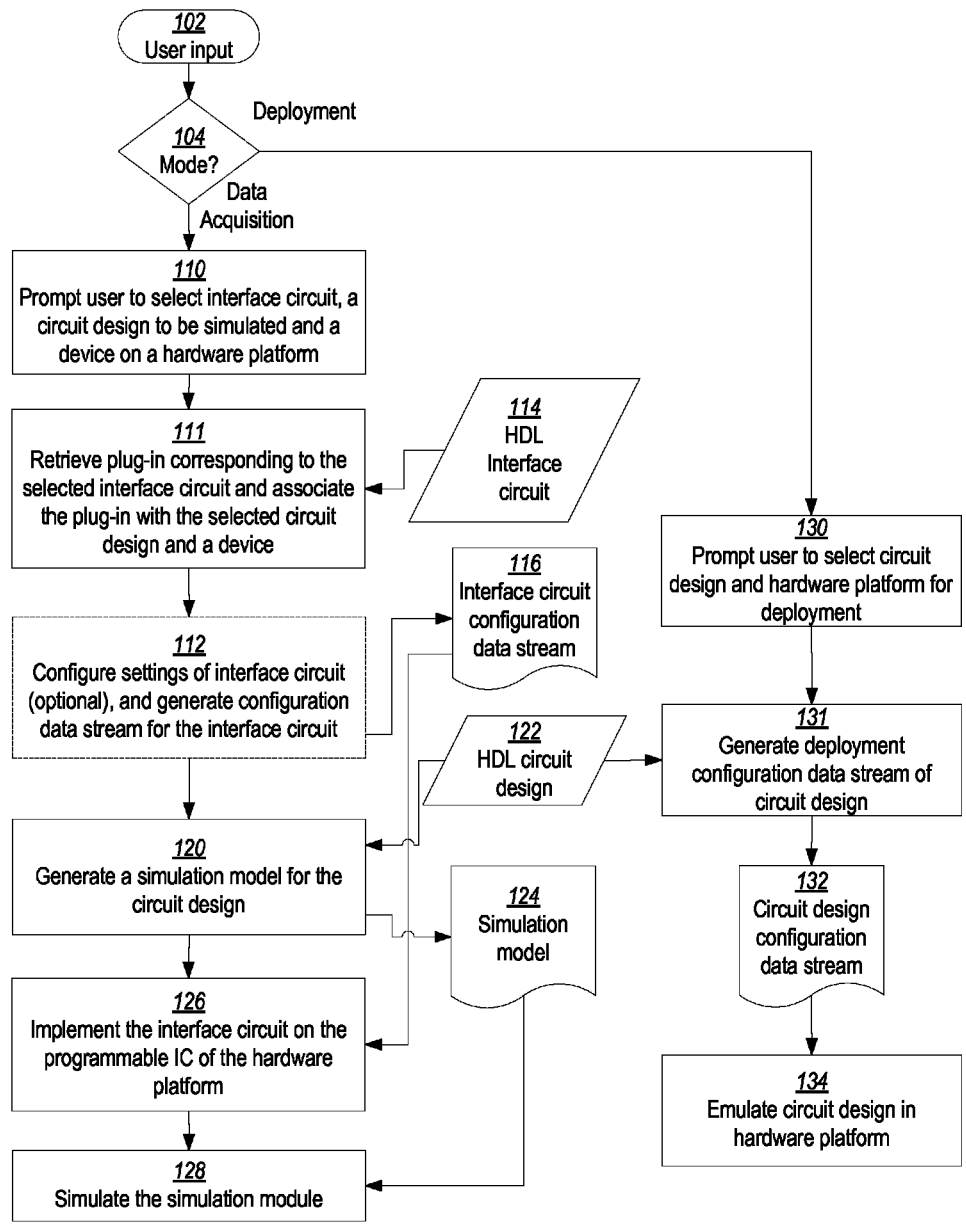
FIG. 1 shows a flowchart of user selection and generation of models of a circuit design in data acquisition and deployment modes of operation.

FIG. 1 illustrates a flowchart of the generation of models of a circuit design in data acquisition and deployment modes of operation. In response to user input 102 indicating a data acquisition mode at decision block 104, at block 110 a user is prompted to select an interface circuit 114, a circuit design to be simulated and a hardware device of a hardware platform from which data signals are to be retrieved during simulation. For instance, a software design tool may have a database including a plurality of different interface circuits, with different processing functions and/or communication options that may be selected by a user. Each of the plurality of interface circuits has a corresponding software plug-in that configures a simulation environment to utilize the interface circuit or co-simulation. At block 111, a software plug-in (not shown) associated with the selected interface circuit is retrieved and associated with the selected circuit design and hardware device. The association of the interface circuit with the selected circuit design and hardware device indicates which ports of the circuit design and hardware device are to be connected to the interface circuit during simulation. In one implementation, the software plug-in may be included in the same data file as the interface circuit 114 input at block 111. In another implementation, the software plug-in corresponding to the selected interface circuit may be retrieved from a separate database.

In some embodiments, at block 112, the HLMS configures settings of the interface circuit (e.g., communication protocols and signal processing performed by the interface circuit) based on the user input and generates a configuration data stream 116 for the interface circuit. The configuration data stream need not be generated as part of the data acquisition process. Rather, the configuration data stream for the selected interface circuit may be input from a location indicated by the user. A simulation model 124 is generated for the circuit design 122 at block 120. The simulation model is configured by the software plug-in to output data from a first port of the circuit design to the interface circuit and input data from the interface circuit to a second port of the circuit design.

The interface circuit is implemented on the hardware platform at block 126 by programming the programmable IC of the hardware platform with the configuration data stream 116 of the interface circuit. The interface circuit is configured to provide data from the first port of the simulated circuit design to a first port of a device on the hardware platform and provide data from a second port of the device to the second port of the simulated circuit design. After implementing the interface circuit on the hardware platform at block 126, the simulation model 124 is simulated at block 128.

In response to user input 102 indicating a deployment mode at decision block 104, a user is prompted to select a circuit design and a hardware platform in which the circuit design is to be deployed at block 130. A configuration data stream 132 is generated from the circuit design 122 at block 131. When operating in the deployment mode, the software plug-in does not perform any remapping of ports of the circuit design. Rather, as indicated above, the ports of the circuit design in the configuration data stream are mapped according to the original mapping of the ports, in which the first and second ports of the circuit design are connected to the first and second ports of the device on the hardware platform. The circuit design is emulated in the hardware platform at block 134 by programming the programmable IC of the hardware platform with the configuration data stream 132.

Figure 2:
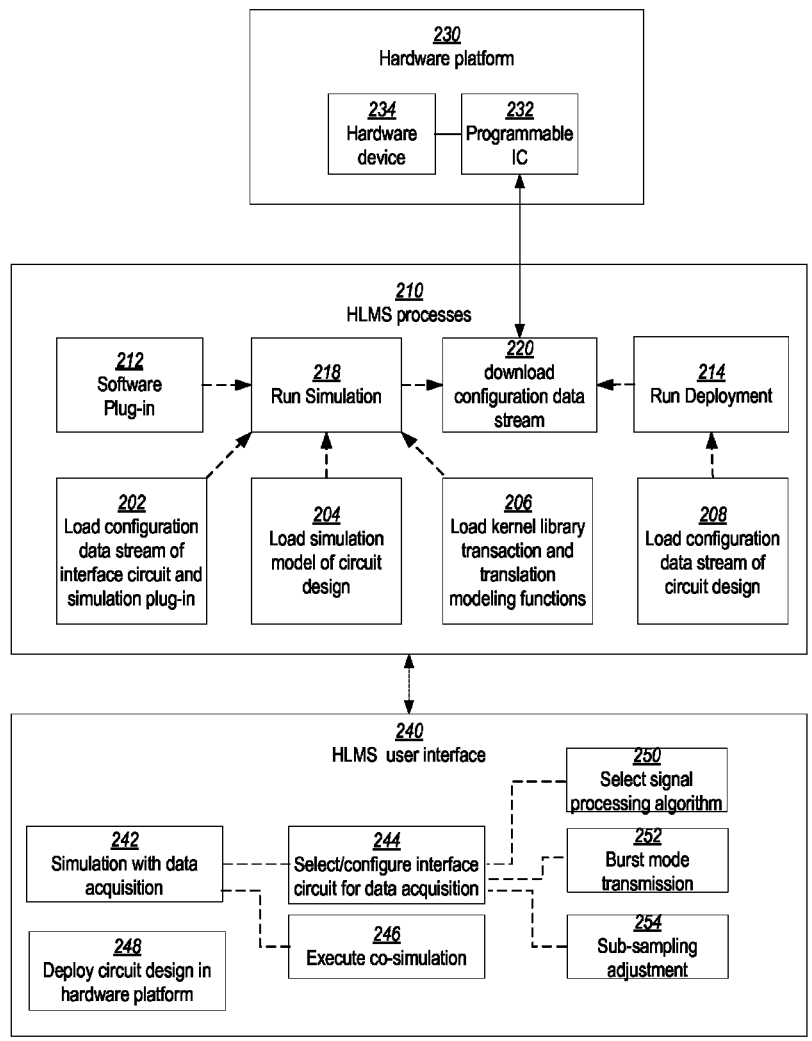
FIG. 2 shows a flowchart for simulation and deployment of a circuit design in a system for co-simulation.

FIG. 2 shows a flowchart of simulation and deployment of a circuit design in a system for co-simulation. The system includes HLMS processes 210 and an HLMS user interface 240 implemented in a computing environment, and a hardware platform 230 connected to the computing environment. The HLMS is configured to simulate a circuit design using data signals captured from a hardware device 234 included on the hardware platform 230.

When the user selects simulation of a circuit design with data acquisition at control interface 242 of the HLMS user interface 240, the user is prompted to select and/or configure an interface circuit for data acquisition via control interface 244 of the HLMS user interface 240, as discussed above with reference to FIG. 1. A configuration data stream (not shown) is loaded into the HLMS by process block 202. As described with reference to FIG. 1, the interface circuit is configured to provide data from the first port of the simulated circuit design to a first port of the hardware device 234 on the hardware platform 230, and provide data from a second port of the device to the second port of the simulated circuit design.

In some implementations, the user interface allows the user to configure the processing and transmission performed by the selected interface circuit. For example, in the HLMS user interface 240 shown in FIG. 2, a user may configure the selected interface circuit with control interface 250 to process data captured from the hardware device 234 according to a particular signal-processing algorithm. For instance, a user may configure the interface circuit to perform a Fourier transformation of data captured from the hardware device 234. Control interface 252 allows a user to configure the interface circuit to communicate data between the HLMS processes 210 and the interface circuit in a burst-mode. When operated in the burst-mode, a plurality of data samples are buffered and transferred between the interface circuit and the HLMS in a continuous data stream. The HLMS user interface 240 also allows a user to configure and/or adjust the interface circuit to perform sub-sampling of data from the hardware device 234 with control interface 254. Sub-sampling may be useful for reducing data communicated between the interface circuit and HLMS processes 210 over a data channel with insufficient bandwidth. Further examples of processing and transmission options are discussed in more detail with reference to FIG. 3.

A software plug-in 212 is also loaded into the HLMS by process block 202. The plug-in maps the first and second ports of the simulated circuit design to the interface circuit implemented in the programmable IC 232. A simulation model of the circuit design is loaded into the HLMS at process block 204. Simulation kernel library data files and the emulation library are loaded into the HLMS, at process block 206, which loads simulation processes into the HLMS. Simulation is performed at process block 218 in response to user input to control interface 246 of the HLMS user interface 240.

Before running the simulation, the configuration data stream of the interface circuit is downloaded to the programmable IC 232 of the hardware platform 230 by process block 220. The simulation model of the circuit design may then be executed. During execution of the simulation model, data from the first port of the simulated circuit design is provided to the interface circuit implemented in the programmable IC 232, and data from the interface circuit is provided to the second port of the simulated circuit design by the software plug-in 212. As indicated above, the interface circuit provides the data received from the first port of the simulated circuit design, via the software plug-in 212, to the first port of the hardware device 234. The interface circuit also provides the data from the second port of the hardware device, via the software plug-in 212, to the second port of the simulated circuit design.

Control interface 248 of the HLMS user interface 240 allows a user to deploy the circuit design in the programmable IC 232 of the hardware platform. In response to user input to the control interface 248, a configuration data stream of the circuit design is loaded into the HLMS at process block 208 and a deployment process is conducted by the HLMS at process block 214. In the deployment process, the configuration data stream of the circuit design is downloaded into the programmable IC via process block 220. As indicated above, when the HLMS is operated in the deployment mode, remapping of ports is not performed by the software plug-in 212. Rather, in the circuit design implemented in the programmable IC 232, the first and second ports circuit design are directly mapped to connect to the first and second ports of the hardware device 234 on the hardware platform as indicated by the circuit design. As indicated above, simulation is performed by the HLMS in the data-acquisition mode, without changing the mapping of ports in source files of the circuit design. This allows the circuit design to be deployed in the programmable IC of the hardware platform, following simulation, without remapping ports of the circuit design.

Figure 3:
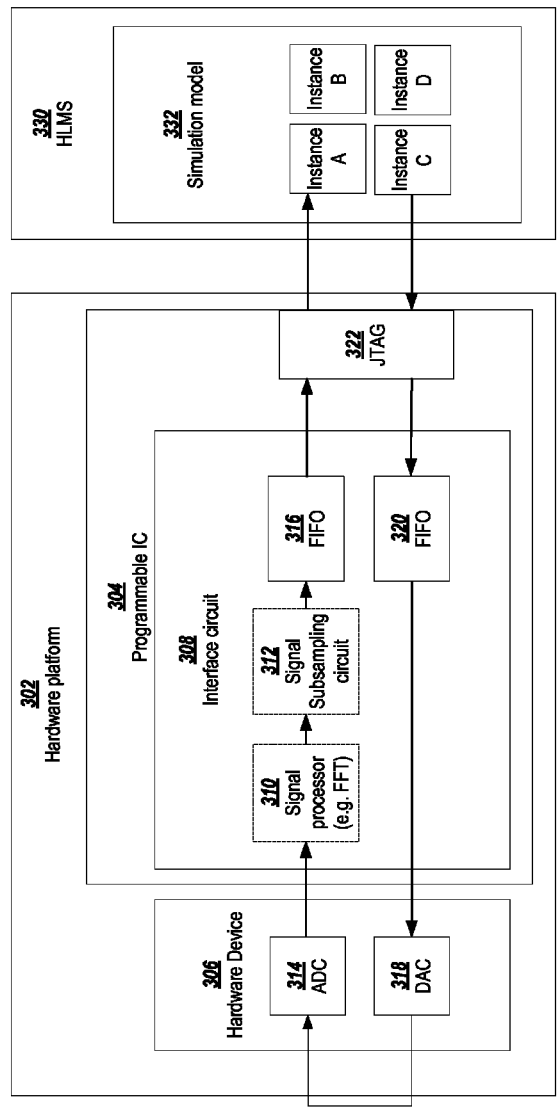
FIG. 3 shows a block diagram of a system for simulation of a circuit design when operating in the data acquisition mode.

FIG. 3 shows a block diagram of a system configured for simulation of a circuit design when operating in the data acquisition mode. The system includes a hardware platform 302 and an HLMS 330 implemented in a computing environment.

Figure 4:
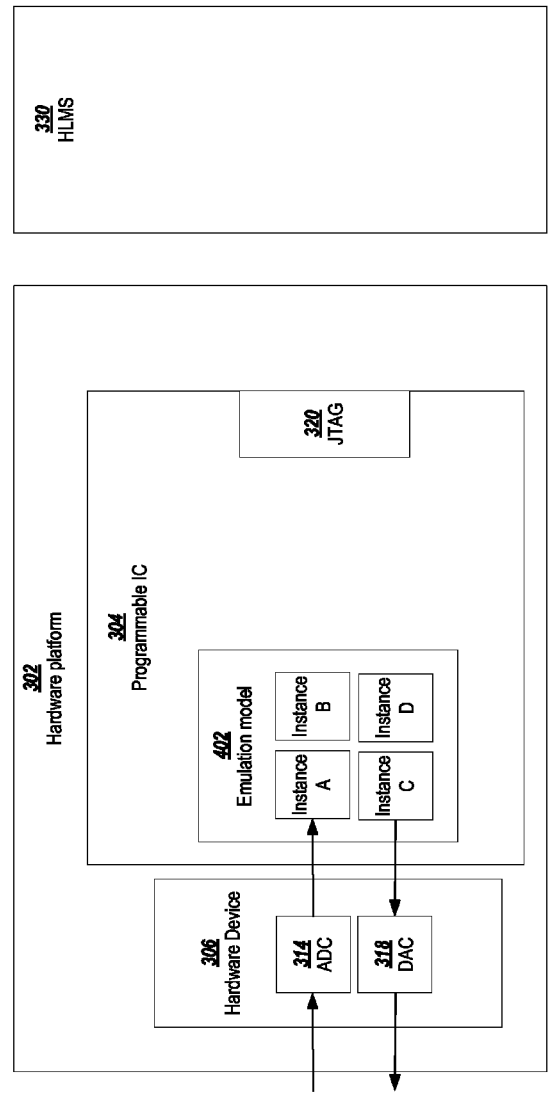
FIG. 4 shows the block diagram of a system shown in FIG. 3 when operating in the deployment mode.

FIG. 4 shows the block diagram of the system shown in FIG. 3 when operating in the deployment mode. During simulation of the circuit design in the data acquisition mode, a simulation model 332 of a circuit design is executed by the HLMS 330. In this example, the hardware platform 302 includes a hardware device 306 having an analog-to-digital converter (ADC) 314 and a digital-to-analog converter (DAC) 318. An analog data signal input to the hardware platform 302 is sampled by the ADC 314 and converted to digital data values. Digital data values provided to the DAC 318 are converted to an analog signal that is output from the hardware platform 302.

Alternatively or additionally, the hardware device 306 may perform other operations. For instance, in some implementations, the hardware device 306 may be configured to convert signals from first-in-first-out FIFO buffer 320 from a first format to a second format configured to control a mechanical stepper motor. Similarly, the hardware device may be configured to receive signals input to the hardware platform from a first format to a second digital format. Other formats and conversion are envisioned as well.

In this example, the circuit design includes four module instances A, B, C, and D. When the system is operated in a deployment mode, as shown in FIG. 4, an emulation model 402 of the circuit design is deployed in the programmable IC 304. As indicated in the source file of the circuit design, a port of module instance C is mapped to DAC 318 to receive digital data values from the ADC 314 and a port of module instance A is mapped to ADC 314 to provide data values to DAC 318.

When the system is operated in the data acquisition mode, as shown in FIG. 3, the HLMS is configured to simulate a simulation model 332 of the circuit design in the HLMS 330. As discussed above, simulation is performed using data signals captured from the hardware device 306 included on the hardware platform 302. An interface circuit 308 is implemented in programmable IC 304 and is configured to communicate data between the hardware device 306 and the HLMS 330 during simulation of the simulation model 332.

In this example, data is communicated between the interface circuit 308 and the HLMS over a communication channel provided by interface 322 using the JTAG format specified by IEEE 1149.1 specification. Data communicated from the HLMS 330 to the interface circuit 308 is buffered in FIFO buffer 320. Data provided to the interface circuit 308 from ADC 314 is buffered in FIFO buffer 316. In some implementations, an analog signal output from the DAC 318 is feedback to an input of the ADC 314 as shown in FIG. 3. However, in some implementations, an analog input signal may be provided to ADC from an external source.

As indicated above, the interface circuit 308 may be configured to implement various transmission and signal-processing options. For instance, in some implementations, the interface circuit is configured to communicate data buffered in FIFO buffer 316 to the HLMS 330 and data from the HLMS 330 to the FIFO buffer 320 using burst-mode communication. In the burst mode, a plurality of data samples from the ADC 314 are buffered in FIFO buffer 316 and communicated to the HLMS 330 in a continuous data stream. Likewise, data output from instance C of the simulation model 332 is buffered by the HLMS 330 and communicated to FIFO buffer 316 in a continuous data stream.

In some implementations, the interface circuit 308 includes a signal processor circuit 310 configured to process digital data values provided by ADC 314 before the data values are buffered in FIFO buffer 316. For example, in some applications, the interface circuit may be configured to perform a fast Fourier transformation (FFT) of the digital data values. As another example, the signal processor 310 may be configured to perform equalization on the digital data values to remove noise present in the sampled values.

In some implementations, the interface circuit 308 includes a sub-sampling circuit 312 configured to adjust a data rate of data values communicated from ADC 314 of the hardware device 306 to the HLMS 330. For instance, the data channel provided by the interface 322 (JTAG) may not have sufficient bandwidth to communicate all of the sampled data values provided to the interface circuit from the ADC 314. Moreover, only a subset of the data values may be required for the simulation of the circuit design. The sub-sampling circuit 312 is configured to adjust the data rate by sub-sampling data values provided from the ADC 314. For instance, the data rate of the data communicated to the HLMS 330 may be reduced by a factor of two by forwarding odd data values provided from the ADC 314 to FIFO buffer 316 and discarding even data values. In some implementations, the sub-sampling circuit 312 is configured to provide data values at a fixed data rate.

In some other implementations, the sub-sampling circuit 312 is configured to dynamically adjust the data rate based on the number of data values buffered in FIFO buffer 316. For instance, in one implementation, the sub-sampling circuit is configured to decrease the frequency at which data values are provided to FIFO buffer 316 in response to FIFO buffer 316 becoming full.

Figure 5:
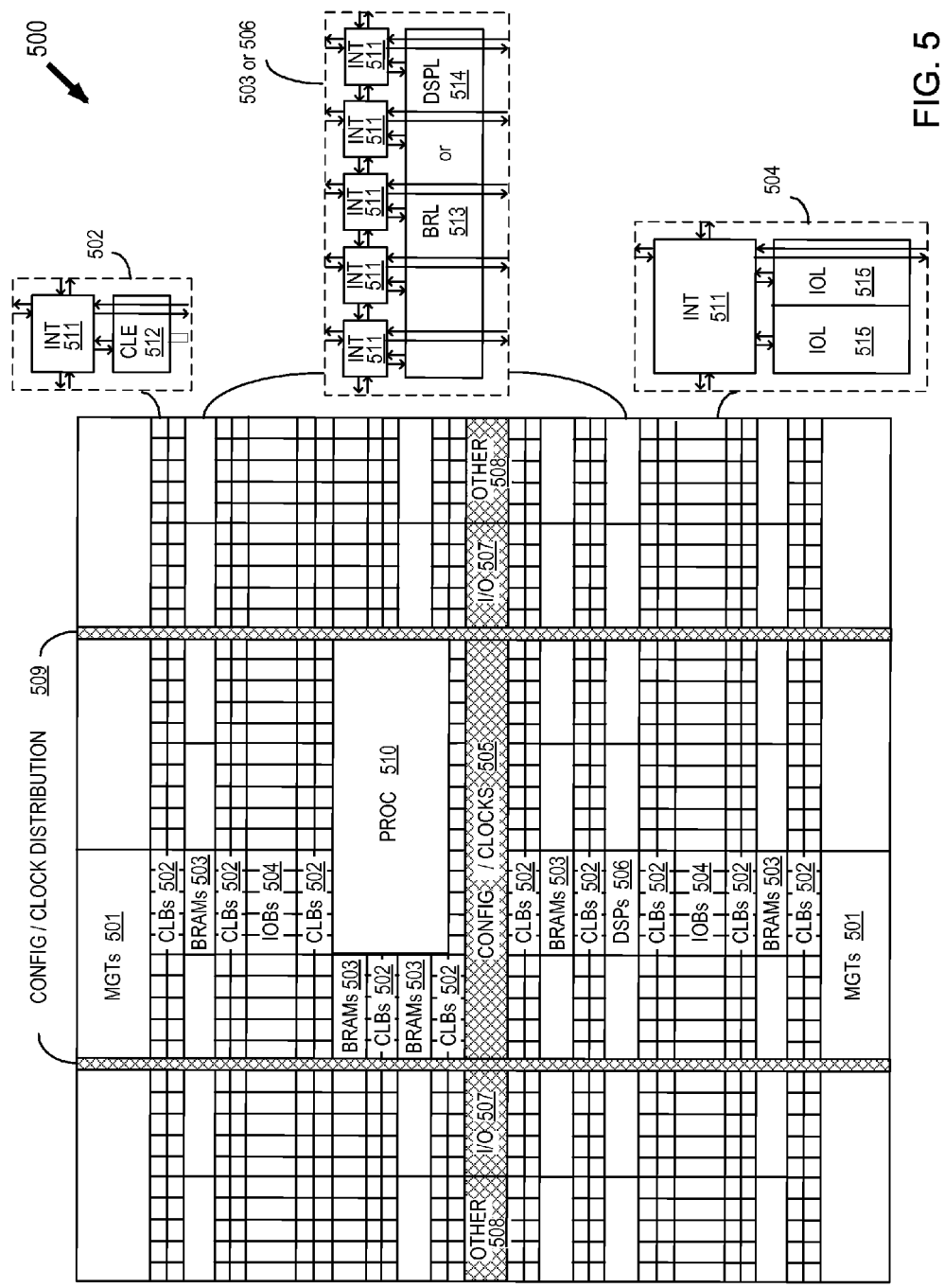
FIG. 5 shows a block diagram of a FPGA that may be configured to implement an interface circuit for co-simulation.

FIG. 5 shows a block diagram of a programmable IC that may be configured to implement an interface circuit for co-simulation. An interface circuit, as previously described, may be implemented on the programmable logic and interconnect resources of a programmable integrated circuit. One type of programmable IC is a field programmable gate array (FPGA). FPGAs can include several different types of programmable logic blocks in the array. For example, FIG. 5 illustrates an FPGA architecture (500) that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal-processing blocks (DSPs 506), specialized input/output blocks (I/O 507), for example, e.g., clock ports, and other programmable logic 508 such as digital clock managers, analog-to-digital converters, system monitoring logic, and so forth. Some FPGAs also include dedicated processor blocks (PROC 510) and internal and external reconfiguration ports (not shown)

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic plus a single programmable interconnect element INT 511. A BRAM 503 can include a BRAM logic element (BRL 513) in addition to one or more programmable interconnect elements. Typically, the number of interconnect elements included in a tile depends on the width of the tile. In the pictured FPGA, a BRAM tile has the same width as five CLBs, but other numbers (e.g., four) can also be used. A DSP tile 506 can include a DSP logic element (DSPL 514) in addition to an appropriate number of programmable interconnect elements. An 10B 504 can include, for example, two instances of an input/output (I/O) logic element 515 in addition to one instance of the programmable interconnect element INT 511. As will be clear to those of skill in the art, the actual I/O pads connected, for example, to the I/O logic element 515 are manufactured using metal layered above the various illustrated logic blocks, and typically are not confined to the area of the input/output logic element 515.

In the pictured FPGA, a horizontal area near the center of the die (shown shaded in FIG. 5) is used for configuration, clock, and other control logic. Vertical areas 509 extending from this horizontal area are used to distribute the clocks and configuration signals across the breadth of the FPGA. Some FPGAs utilizing the architecture illustrated in FIG. 5 include additional logic blocks that disrupt the regular row structure making up a large part of the FPGA. The additional logic blocks can be programmable blocks and/or dedicated logic. For example, the processor block PROC 510 shown in FIG. 5 spans several rows of CLBs and BRAMs.

Note that FIG. 5 is intended to illustrate only an exemplary FPGA architecture. The numbers of logic blocks in a row, the relative heights of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic.

Figure 6:
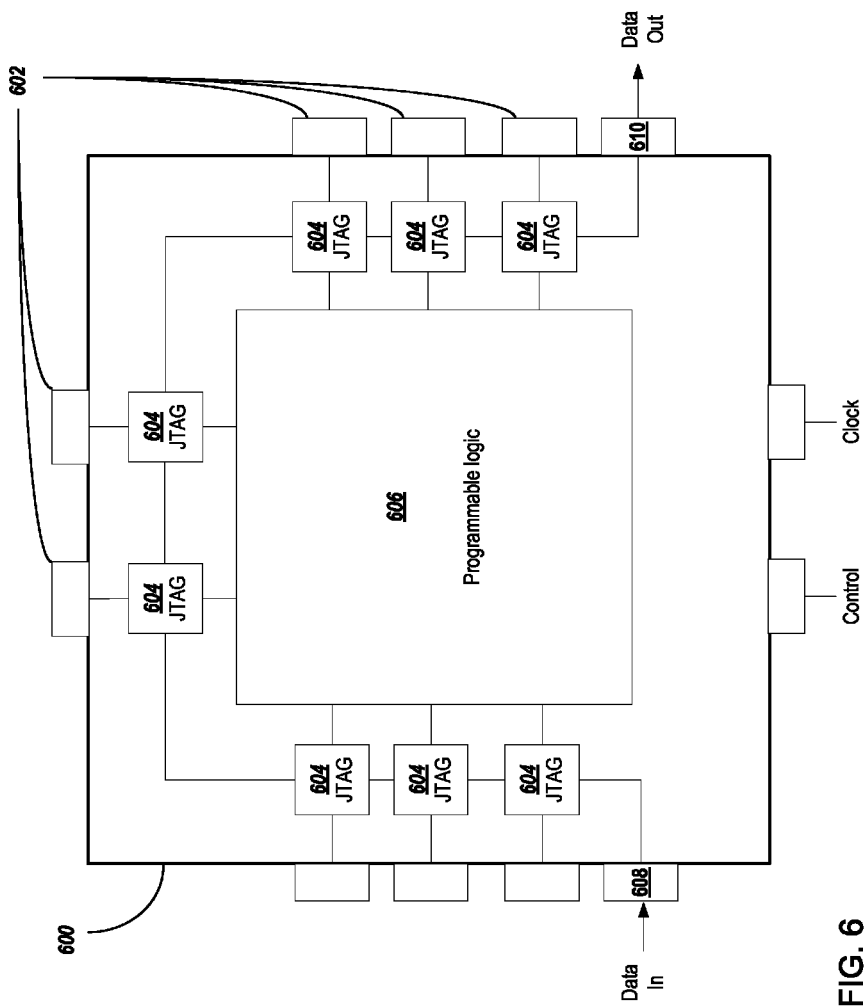
FIG. 6 shows a block diagram of a programmable logic device with JTAG capability.

FIG. 6 shows a block diagram of a programmable IC with JTAG capability. The programmable IC 600 contains programmable logic 606, input/output pins 602 with JTAG blocks 604 for each input/output pin. The programmable logic may be configured to implement an interface circuit or a circuit design, as previously described. The JTAG blocks can detect the value of the respective input/output pins as well as set the values that are received by the programmable logic. Each JTAG block has an address and can send and receive data through JTAG serial data ports 608 and 610 according to the IEEE 1149.1 specification. Various embodiments of the disclosure utilize JTAG to send emulation input and receive emulation output to and from the device on a per clock cycle basis.

Figure 7:
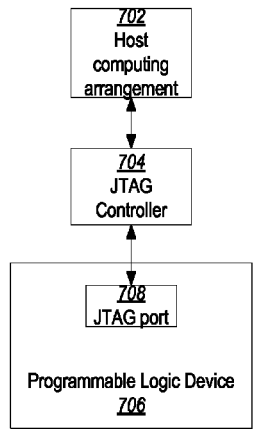
FIG. 7 shows a block diagram of a system for co-simulation which is adapted to communicate data between a hardware platform and the HLMS using the JTAG protocol.

FIG. 7 shows a block diagram of a system for co-simulation which is adapted to communicate data between a hardware platform and the HLMS using the IEEE 1149.1 JTAG protocol. A host computing arrangement 702 is configured to host the HLMS and perform the configuration, simulation, and user interface processes. A programmable IC 706 configured with a JTAG port 708 is used to implement the interface circuit when the system is operating in a data acquisition mode and implement the circuit design when operating the system in a deployment mode. Communications between the HLMS and the programmable IC are controlled by a JTAG controller 704. The JTAG controller communicates with the programmable IC according to IEEE 1149.1 specifications and relays communications to the host computing arrangement.

Figure 8:
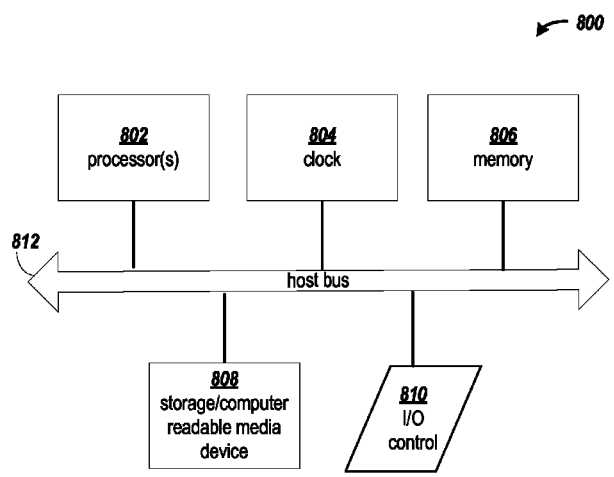
FIG. 8 shows a block diagram of an example computing arrangement that may be configured to implement the HLMS processes described herein.

FIG. 8 shows a block diagram of an example computing arrangement that may be configured to implement the HLMS processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 800 includes one or more processors 802, a clock signal generator 804, a memory arrangement 806, a storage arrangement 808, and an input/output control unit 810, all coupled to a host bus 812. The processor computing arrangement 800 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 802 may be one or more general-purpose processors, or a combination of one or more general-purpose processors and suitable co-processors, or one or more specialized processors (e.g., RISC, CISC, pipelined, etc.).

The memory arrangement 806 typically includes multiple levels of cache memory, and a main memory. The storage arrangement 808 may include local and/or remote persistent storage, such as provided by magnetic disks (not shown), flash, EPROM, or other non-volatile data storage. The storage unit may be read or read/write capable. Further, the memory arrangement 806 and storage arrangement 808 may be combined in a single arrangement.

The processor(s) 802 executes the software in storage arrangement 808 and/or memory arrangement 806, reads data from and stores data to the storage arrangement 808 and/or memory arrangement 806, and communicates with external devices through the input/output control arrangement 810. These functions are synchronized by the clock signal generator 804. The resource of the computing arrangement may be managed by either an operating system (not shown), or a hardware control unit (not shown).

The embodiments are thought to be applicable to a variety of systems for simulation of a circuit design. Other aspects and embodiments will be apparent to those skilled in the art from consideration of the specification. The embodiments may be implemented as one or more processors configured to execute software, as an application specific integrated circuit (ASIC), or as a logic on a programmable logic device, for example. It is intended that the specification and illustrated embodiments be considered as examples only, with a true scope of the invention being indicated by the following claims.

What is claimed is:

1. A method of processing a circuit design, comprising:
   providing a user-selectable plug-in for compilation of the circuit design, the plug-in being associated with an interface circuit;
   associating the plug-in with a device on a hardware platform and with the circuit design, the circuit design having a first set of ports, configured to couple to respective ports of a first set of ports of the associated device, the circuit design having a second set of ports, configured to couple to respective ports of a second set of ports of the associated device;
   in response to user input and the plug-in being in a data-acquisition mode:
      generating a simulation model of the circuit design having first and second sets of ports coupled to respective first and second sets of ports of an interface circuit;
      emulating the interface circuit on the hardware platform; and
      simulating the simulation model in a software simulation environment, and during the simulating, the interface circuit providing data from each of the first set of ports of the circuit design to a respective port of the first set of ports of the associated device and providing data from each of the second set of ports of the associated device to a respective port of the second set of ports of the circuit design; and
   in response to user input and the plug-in being in a deployment mode, generating, by a processor, an implementation of the circuit design having the first and second sets of ports of the circuit design respectively coupled to the first and second sets of ports of the associated device.

2. The method of claim 1, further comprising emulating the generated implementation of the circuit design in the hardware platform in response to the user input and the plug-in being in the deployment mode.

3. The method of claim 1, further comprising using the associated device to:
   convert digital signals input to the first set of ports of the associated device from a first signal format to a second signal format; and
   convert input signals in the second signal format to the first signal format and outputting the input signals on respective ports of the second set of ports of the associated device.

4. The method of claim 3, wherein the first signal format is a digital signal format and the second signal format is an analog signal format.

5. The method of claim 4, wherein the first signal format is a digital signal format and the second signal format is a coding indicating positional information of a mechanical stepper motor.

6. The method of claim 3, further comprising, during the simulating:
   buffering the data from each of the first set of ports of the circuit design in a respective first first-in-first-out (FIFO) buffer; and
   buffering the data from each of the second set of ports of the associated device in a respective second FIFO buffer.

7. The method of claim 6, wherein the providing data from the first set of ports of the circuit design to the first set of ports of the associated device and providing data from the second set of ports of the associated device to the second set of ports of the circuit design includes, in response to a user command:
   transmitting the data from each of the first set of ports of the circuit design to the respective first FIFO buffer in a burst mode; and
   transmitting the data received at each of the second set of ports of the associated device from the respective second FIFO buffer to a respective port of the second set of ports of the associated device in the burst mode.

8. The method of claim 6, further comprising, during the simulating, sub-sampling the data values from each of the second set of ports of the associated device.

9. The method of claim 8, further comprising, during the simulating, reducing a rate of the sub-sampling from the second set of ports of the associated device in response to the corresponding second FIFO buffer becoming full.

10. The method of claim 1, further comprising, during the simulating, performing signal-processing of analog values from the second set of ports of the associated device.

11. The method of claim 1, further comprising, during the simulating:
   providing a first clock from the software simulation environment to the interface circuit; and
   providing a second clock from the associated device to the interface circuit, the second clock having a different clock rate than the first clock.

12. The method of claim 2, further comprising, during the emulating:
   providing a clock from the hardware platform to the circuit design.

13. A system for co-simulation of a portion of a circuit design, comprising:
   a hardware platform including a programmable integrated circuit (IC) and a device coupled to the programmable IC; and
   a computing arrangement including a processor and memory coupled to the hardware platform;
   wherein the computing arrangement is configured to:
   associate a user-selectable plug-in with the device on the hardware platform and with the circuit design, the plug-in having a user-selectable data-acquisition mode and deployment mode, the circuit design having a first set of ports, including at least a first port, each configured to couple to a respective port of a first set of ports of the associated device, and having a second set of ports, including at least a second port, each configured to couple to a respective port of a second set of ports of the associated device;
   in response to user input and the plug-in being in the data-acquisition mode:
      generate a simulation model of the circuit design, the simulation model having a first set of ports, each coupled to respective ports of a first set of ports of an interface circuit, and a second set of ports, each coupled to respective ports of a second set of ports of the interface circuit;
      configure the programmable IC of the hardware platform to emulate the interface circuit; and
      simulate the simulation model in a software simulation environment, and during the simulating, the interface circuit providing data from each of the first set of ports of the circuit design to respective ports of a first set of ports of the associated device and providing data from each of a second set of ports of the associated device to respective ports of the second set of ports of the circuit design; and
   in response to user input and the plug-in being in the deployment mode, configuring the programmable IC to emulate the circuit design having each of the first set of ports of the circuit design coupled to respective ports of the first set of ports of the associated device and having each of the second set of ports of the circuit design coupled to respective ports of the second set of ports of the associated device.

14. The system of claim 13, wherein the associated device includes:
   a first circuit configured to convert digital signals input to the first set of ports of the associated device from a first signal format to a second signal format; and
   a second circuit configured to convert input signals in the second signal format to the first signal format and outputting the input signals on respective ports of the second set of ports of the associated device.

15. The system of claim 14, wherein the first signal format is a digital signal format and the second signal format is an analog signal format.

16. The system of claim 14, wherein the first signal format is a digital signal format and the second signal format is a coding indicating positional information of a mechanical stepper motor.

17. The system of claim 13, wherein the interface circuit includes:
   a first set of first-in-first-out (FIFO) buffers, each configured to buffer the data from a respective port of the first set of ports of the circuit design; and
   a second set of FIFO buffers, each configured to buffer the data from a respective port of the second set of ports of the associated device.

18. The system of claim 17, wherein the interface circuit is configured to:
   transmit data from each of the first set of ports of the circuit design to the respective first FIFO buffer in a burst mode; and
   transmit data received at each of the second set of ports of the associated device from the respective second FIFO buffer to a respective port of the second set of ports of the associated device in the burst mode.

19. The system of claim 18, wherein the interface circuit further includes a sub-sampling circuit configured to:
- sub-sample the data values from one of the second set of ports of the associated device; and
- provide the sub-sampled data values to a corresponding one of the second set of FIFO buffers.

20. The system of claim 19, wherein the sub-sampling circuit is configured to reduce a rate of the sub-sampling from the one of the second set of ports of the associated device in response to the corresponding one of the second set of FIFO buffers becoming full.

* * * * *